(12) United States Patent
Ko

(10) Patent No.: US 7,574,185 B2
(45) Date of Patent: Aug. 11, 2009

(54) METHOD AND APPARATUS FOR GENERATING A PHASE-LOCKED OUTPUT SIGNAL

(75) Inventor: Herbert L. Ko, Mountain View, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 774 days.

(21) Appl. No.: 11/015,132

(22) Filed: Dec. 17, 2004

(65) Prior Publication Data

US 2006/0141966 A1    Jun. 29, 2006

(51) Int. Cl.
*H04B 1/06* (2006.01)
(52) U.S. Cl. .................. 455/255; 455/260; 455/258; 455/76
(58) Field of Classification Search ......... 455/255–268, 455/76; 331/16
See application file for complete search history.

(56) References Cited

U.S. PATENT DOCUMENTS

| | | | | |
|---|---|---|---|---|
| 5,144,254 A | * | 9/1992 | Wilke | 327/107 |
| 5,329,250 A | * | 7/1994 | Imaizumi et al. | 331/2 |
| 5,610,558 A | * | 3/1997 | Mittel et al. | 331/2 |
| 6,094,569 A | * | 7/2000 | Wang | 455/265 |
| 6,297,702 B1 | * | 10/2001 | Locker et al. | 331/2 |
| 6,308,048 B1 | * | 10/2001 | Gore et al. | 455/76 |
| 6,356,129 B1 | * | 3/2002 | O'Brien et al. | 327/175 |
| 6,833,764 B1 | * | 12/2004 | Dean | 331/2 |
| 6,975,176 B2 | * | 12/2005 | Loke et al. | 455/263 |
| 7,301,404 B2 | * | 11/2007 | Mattisson | 455/260 |
| 7,372,339 B2 | * | 5/2008 | Fu | 331/16 |
| 2006/0001494 A1 | * | 1/2006 | Garlepp et al. | 331/2 |
| 2006/0067454 A1 | * | 3/2006 | Camuffo | 455/260 |
| 2006/0220750 A1 | * | 10/2006 | Akamine et al. | 331/16 |

* cited by examiner

*Primary Examiner*—Lana N Le
(74) *Attorney, Agent, or Firm*—Holland & Hart, LLP

(57) ABSTRACT

A method and apparatus for generating a phase-locked output signal includes generating an intermediate signal phase locked to an input signal by frequency dividing the intermediate signal by a temporally-varying divide ratio sequence to generate a first feedback signal and phase comparing the first feedback signal with the input signal. An output signal is generated phase locked to the first feedback signal by frequency dividing the output signal by the temporally-varying divide ratio sequence to generate a second feedback signal and phase comparing the second feedback signal with the first feedback signal.

20 Claims, 2 Drawing Sheets

METHOD AND APPARATUS FOR GENERATING A PHASE-LOCKED OUTPUT SIGNAL

BACKGROUND ART

The present invention relates generally to generating a phase-locked output signal, and more particularly to a method and apparatus for generating a phase-locked output signal in a Fractional_N phase-locked loop.

Phase-locked loops PLLs) are widely used in many different applications. One typical application for PLLs is in variable frequency synthesizers. Variable frequency synthesizers are capable of providing stable and accurate signals with low spurious components, low phase noise, and fast switching between selected frequencies.

However, the resolution of the output frequency of a conventional PLL with an integer divide ratio is limited to N*(input frequency), where N is the integer divide ratio. To achieve a finer frequency resolution, a Fractional_N technique often is employed. The Fractional_N technique temporally alternates the divide ratio in the PLL between N and N+1. The output frequency then becomes (N+r)*(input frequency) where r is the fraction of the time that the divide ratio is N+1. Typically, the divide ratio is alternated using a frequency divider whose divide ratio is dynamically alternated between N and N+1 to produce an average divide ratio equal to a desired non-integer divide ratio. In some embodiments, it is advantageous to use a wider divide ratio range that extends from N−1 to N+2 with an average divide ratio of N+r. The principle of operation of such embodiment remains unchanged from an embodiment in which the divide ratios are N and N+1.

Although Fractional-N PLLs are capable of producing output signals with a fine frequency resolution, these PLLs have several performance disadvantages. For example, dynamically alternating the divide ratio generates quantization noise and frequency spurs in the output signal. The quantization noise and frequency spurs may degrade the performance of the instrument or system in which the Fractional-N PLL is used. Quantization noise is undesirable in most systems as it introduces errors in the output signal of the Fractional_N PLL.

To reduce quantization noise and frequency spurs, a circuit called a sigma-delta modulator is used in PLLs to generate a divide ratio sequence for controlling the divide ratio of the frequency divider. Using a suitable sigma-delta modulator moves some of the quantization noise and frequency spurs out of the frequency range of interest so that the quantization noise and frequency spurs can be filtered from the output of the phase comparator. Typically, a loop filter is used to filter the output of the phase comparator and produce an output signal of the Fractional_N PLL that is relatively free of quantization noise and frequency spurs. However, residual quantization noise and frequency spurs remain at a level too high for certain applications.

Although attempts have been made to deal with the problems associated with residual quantization noise and frequency spurs, existing solutions are complex and expensive to implement due to the complexity of the circuitry required. Solutions to these problems have long been sought but prior developments have not taught or suggested any solutions and, thus, solutions to these problems have long eluded those skilled in the art.

DISCLOSURE OF THE INVENTION

The present invention provides a method and apparatus for generating a phase-locked output signal. In one embodiment, an intermediate signal is generated phase locked to an input signal. The intermediate signal is frequency divided by a temporally-varying divide ratio sequence to generate a first feedback signal that is phase compared with the input signal. An output signal phase locked to the first feedback signal is generated by frequency dividing the output signal by the temporally-varying divide ratio sequence to generate a second feedback signal and phase comparing the second feedback signal with the first feedback signal.

Certain embodiments of the invention have other aspects in addition to or in place of those mentioned above. The other aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Figure 1:
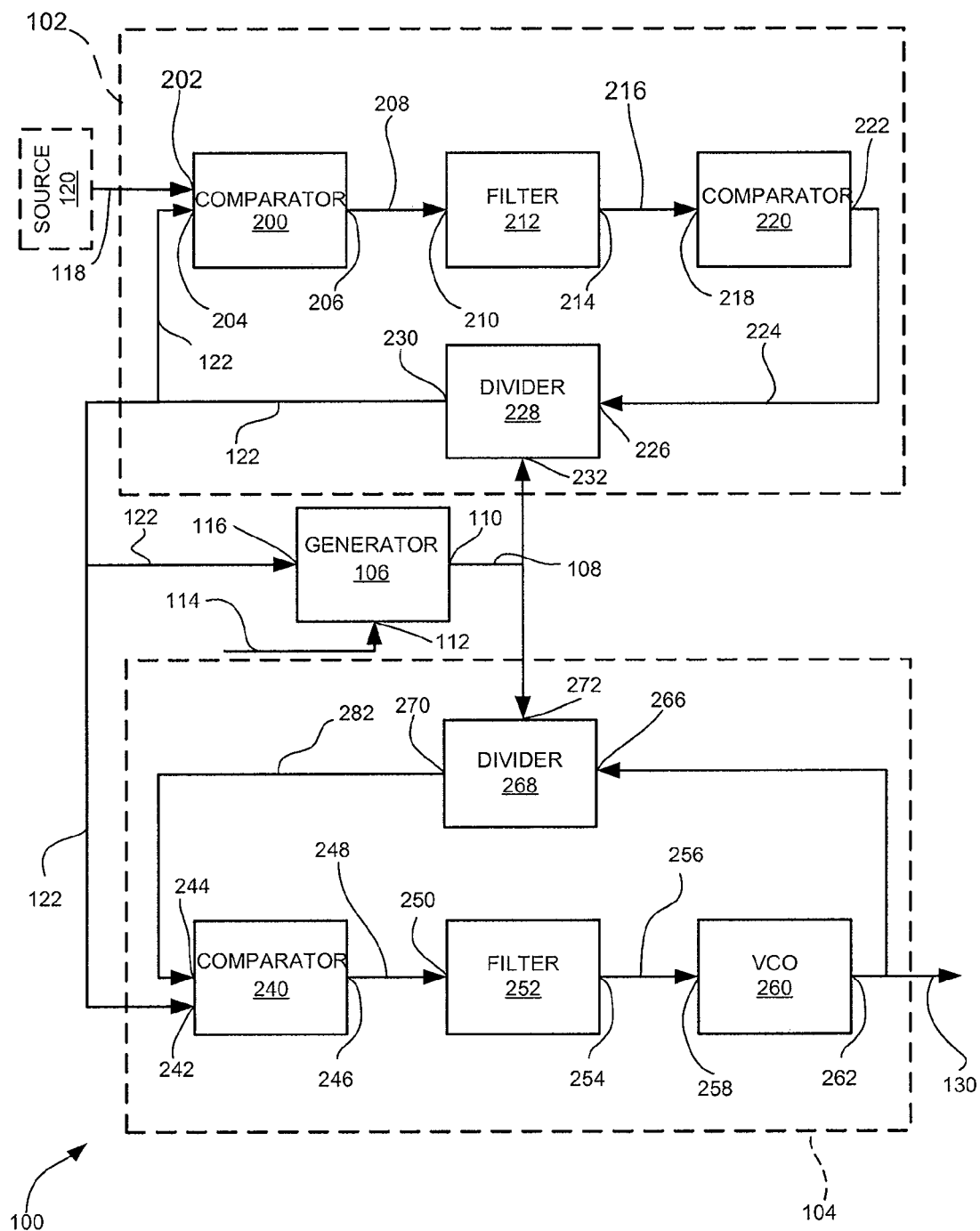
FIG. 1 is a block diagram of a Fractional_N phase-locked loop using a common divide ratio control signal in accordance with an embodiment of the present invention.

Referring now to FIG. 1, therein is shown a block diagram of a Fractional_N phase-locked loop (FNPLL) 100 in accordance with an embodiment of the present invention. The FNPLL 100 generates from an input signal an output signal having a frequency defined by a divide ratio signal that defines a non-integer divide ratio.

The FNPLL 100 includes a first phase-locked loop (PLL) 102 and a second PLL 104. A divide ratio sequence generator 106 provides a temporally-varying divide ratio sequence 108 that is a common input to both the first PLL 102 and the second PLL 104. The divide ratio sequence generator 106 is a modulator typically of an order higher than a first order modulator that receives a divide ratio control signal 114. In an embodiment, the divide ratio sequence generator is a third-order sigma-delta modulator. The sigma-delta modulator derives from the divide ratio control signal 114 a sigma-delta modulated divide ratio sequence that provides the temporally-varying divide ratio sequence 108.

The divide ratio sequence generator 106 has an output 110, an input 112 connected to receive the divide ratio control signal 114, and a clock input 116. The divide ratio control signal 114 precisely defines the divide ratio of the FNPLL 100. In one example, the divide ratio control signal is a 30-bit signal that defines the divide ratio and, hence, the frequency of the output signal, with a resolution of one part in $2^{30}$. The divide ratio sequence generator 106 derives the temporally-varying divide ratio sequence 108 from the divide ratio control signal 114 received at its divide ratio control input 112. The divide ratio sequence generator 106 outputs the temporally-varying divide ratio sequence 108 at its output 110.

The first PLL 102 receives an input signal 118 from an input signal source 120. In an embodiment in which the FNPLL 100 forms part of a frequency synthesizer, the input signal is a frequency reference signal. The first PLL 102 generates from the input signal 118 a phase-locked intermediate signal 224. A first frequency divider 228 generates a first feedback signal 122 by dividing the frequency of the phase-locked intermediate signal 224 by a division ratio determined by the temporally-varying divide ratio sequence 108 received from the divide ratio sequence generator 106. The first feedback signal 122 provides a feedback signal for the first PLL 102, and additionally provides an input signal for the second PLL 104 and a clock signal for the divide ratio sequence generator 106.

The second PLL 104 generates from the first feedback signal 122 a phase-locked output signal 130 phase-locked to the first feedback signal 122. A second frequency divider 268 generates a second feedback signal 282 by dividing the frequency of the phase-locked output signal 130 by the division ratio determined by the temporally-varying divide ratio sequence 108 received from the divide ratio sequence generator 106.

In a typical embodiment, the temporally-varying divide ratio sequence causes the divide ratio of the frequency dividers 228 and 268 to alternate between N and N+1 to produce an average divide ratio (N+r) equal to the non-integer divide ratio defined by the divide ratio control signal 114. In other embodiments, it is advantageous to use a wider range of divide ratios in which the divide ratios have an average of (N+r). For example, the divide ratio may switch among the following values: (N−1), N, (N+1) and (N+2). The principle of operation of such an embodiment remains that same as that of an embodiment in which the divide ratio alternates between N and N+1.

Each of the PLLs 102 and 104 includes a phase comparator having a signal input, a feedback input, and an output. Each of the PLLs 102 and 104 also has a loop filter, a voltage-controlled oscillator (VCO), and a frequency divider. In each of the PLLs, the loop filter, the VCO, and the frequency divider are connected in series between the PLL output and the feedback input of the respective phase comparator, as described below.

The first PLL 102 and the second PLL 104 are constructed of identical components. The use of identical components reduces the likelihood that quantization noise or frequency spurs will be introduced because of corresponding components in the PLLs having different characteristics.

The first PLL 102 is composed of a first phase comparator 200, a first loop filter 212, a first voltage-controlled oscillator (VCO) 220 and the first frequency divider 228.

The first phase comparator 200 has a signal input 202, a feedback input 204, and an output 206. The signal input 202 is connected to the input signal source 120 to receive the input signal 108 provided by the input signal source 120. The first loop filter 212, the first VCO 220, and the first frequency divider 228 are connected in series between the output 206 and the feedback input 204 of the first phase comparator 200.

The first loop filter 212 has an input 210 and an output 214. The input 210 is connected to the output 206 of the first phase comparator 200 to receive a first comparison signal 208 generated by the first phase comparator 200.

The first VCO 220 has an input 218 and an output 222. The input 218 is connected to the output 214 of the first loop filter 212 to receive a first frequency control signal 216 generated by the first loop filter 212.

The first frequency divider 228 has an input 226, an output 230 and a control input 232. The input 226 is connected to the output 222 of the first VCO 220 to receive the phase-locked intermediate signal 224 generated by the first VCO 220. The output 230 is connected to the feedback input 204 of the first phase comparator 200, the clock input 116 of the divide ratio sequence generator 106, and the signal input 242 of a second phase comparator 240 that forms part of the second phase-lock loop 104 to provide the first feedback signal 122 thereto. The control input 232 is connected to the output 110 of the divide ratio sequence generator 106 to receive the temporally-varying divide ratio sequence 108 generated by the divide ratio sequence generator 106.

The second PLL 104 is composed of the second phase comparator 240, a second loop filter 252, a second voltage-controlled oscillator (VCO) 260 and a second frequency divider 268.

The second phase comparator 240 has a signal input 242, a feedback input 244, and an output 246. The signal input 242 is connected to the output 230 of the first frequency divider 228, as described above. The second loop filter 252, the second VCO 260, and the second frequency divider 268 are connected in series between the output 246 and the feedback input 244 of the second phase comparator 240.

The second loop filter 252 has an input 250 and an output 254. The input 250 is connected to the output 246 of the second phase comparator 240 to receive a second comparison signal 248 generated by the second phase comparator 240.

The second VCO 260 has an input 258 and an output 262. The input 258 is connected to the output 254 of the second loop filter 252 to receive a second frequency control signal 256 generated by the second loop filter 252. The second frequency divider 268 has an input 266, an output 270, and a control input 272. The input 266 is connected to the output 262 of the second VCO 260 to receive the output signal 130 generated by the second VCO 260. The output 270 is connected to the feedback input 244 of the second phase comparator 240 to provide the second feedback signal 282 thereto. The control input 272 is connected to the output 110 of the divide ratio sequence generator 106 to receive the temporally-varying divide ratio sequence 108 generated by the divide ratio sequence generator 106.

The FNPLL 100 operates as follows. The first phase comparator 200 receives the input signal 118 at its signal input 202 and receives the first feedback signal 122 at its feedback input 204. The first feedback signal 122 is generated from the intermediate signal 224 by the first frequency divider 228. In response to the input signal 118 and the first feedback signal 122, the first phase comparator 200 generates the first comparison signal 208 that represents any phase difference between the input signal 118 and the first feedback signal 122. The first loop filter 212 filters quantization noise and frequency spurs from the first comparison signal 208 to provide the first frequency control signal 216 to the first VCO 220.

In response to the first frequency control signal 216, the first VCO 220 generates the intermediate signal 224 at a frequency nominally (N+r) times that of the input signal 118, where N and r are as defined above. The first frequency divider 228 receives the intermediate signal 224 from the first VCO 220 and additionally receives the temporally-varying divide ratio sequence 108 generated by the divide ratio sequence generator 106 in response to the divide ratio control signal 114. In response to the temporally-varying divide ratio sequence 108, the division ratio of the first frequency divider 228 alternates between N and N+1 with a duty cycle equal to r. The first frequency divider 228 divides the frequency of the intermediate signal 224 by an average division ratio equal to (N+r) to generate the first feedback signal 122 at a frequency nominally equal to that of the input signal 118.

The intermediate signal 224 has a nominal frequency of (N+r) times the frequency of the input signal 118, where N and r are as defined above. Since the division ratio of the first frequency divider 228 alternates between N and N+1, the phase of the first feedback signal 122 changes relative to that of the input signal 118 each time the division ratio changes. The resulting phase difference between the inputs 202 and 204 of the first phase comparator 200 causes large pulses in the comparison signal 208, which, after filtering by the loop filter 216, can still induce significant phase shifts in the output 222 of the first VCO 220 and, hence, in the first feedback signal 122. The process just described is what causes quantization noise and frequency spurs in a conventional FNPLL.

In the FNPLL 100 in accordance with the invention, the second phase comparator 240 of the second PLL 104 receives the first feedback signal 122 at its signal input 242 and receives the second feedback signal 282 at its feedback input 244. The second feedback signal 282 is generated from the output signal 130 by the second frequency divider 268. As noted above, a phase shift is induced in the first feedback signal 122 each time the division ratio of the first frequency divider 228 changes in response to the temporally-varying divide ratio sequence 108. In response to the first feedback signal 122 and the second feedback signal 282, the second phase comparator 240 generates the second comparison signal 248 that represents any phase difference between the first feedback signal 122 and the second feedback signal 282. The second loop filter 252 filters the second comparison signal 248 to provide the second frequency control signal 256 to the second VCO 260. In response to the second frequency control signal 256, the second VCO 260 generates the output signal 130 at a frequency nominally (N+r) times that of the first feedback signal 122, where N and r are as defined above.

The second frequency divider 268 receives the output signal 130 from the second VCO 260 and additionally receives the temporally-varying divide ratio sequence 108 generated by the divide ratio sequence generator 106 in response to the divide ratio control signal 114. In response to the temporally-varying divide ratio sequence 108, the division ratio of the second frequency divider 268 alternates between N and N+1 with a duty cycle equal to r. The second frequency divider 268 divides the frequency of the output signal 130 by an average division ratio of (N+r) to generate the second feedback signal 282 at a frequency nominally equal to that of the first feedback signal 122.

The output signal 130 has a nominal frequency of (N+r) times the frequency of the first feedback signal 122, where N and r are as defined above. Since the division ratio of the second frequency divider 268 alternates between N and N+1, the phase of the second feedback signal 282 changes each time the division ratio changes. However, since the phase shifts in the second feedback signal 282 are the same as, and occur synchronously with, the phase shifts in the first feedback signal 122, the second comparison signal 248 generated by the second phase comparator 240 does not change in response to these simultaneous, equal changes in the frequencies of the first feedback signal 122 and the second feedback signal 282. Consequently, the frequency of the output signal 130 remains substantially constant at its nominal value, and the output signal 130 is substantially free of the quantization noise and frequency spurs referred to above.

The FNPLL 100 in accordance with the present invention has a temporally-varying divide ratio but quantization noise and frequency spurs in the output signal 130 are substantially less than in a conventional FNPLL circuit. The reduction in quantization noise and frequency spurs is the result of the first feedback signal 122 and the second feedback signal 282 being subject to the same temporal variation in the divide ratio used to derive them because both the first frequency divider 228 and the second frequency divider 268 receive the same temporally-varying divide ratio sequence 108 from the divide ratio sequence generator 106. Since both the first feedback signal 122 and the second feedback signal 282 are subject to the same phase changes, the second comparison signal 248 does not change as the temporally-varying divide ratio sequence 108 changes the divide ratios of the first frequency divider 228 and the second frequency divider 268. The output signal 130 generated by the second VCO 260 is therefore free of the artifacts present in the intermediate signal 224 generated by the first VCO 220. Residual quantization noise and frequency spurs in the output signal 130 are reduced to a level below that obtainable by optimizing the loop filter of a single phase-locked loop.

Additionally, since the components of the first PLL 102 and the components of the second PLL 104 are substantially identical, the design of one of the first or second phase-locked loops can be used as the design of the other phase-locked loops. This reduces circuit design time, effort, and expense.

Figure 2:
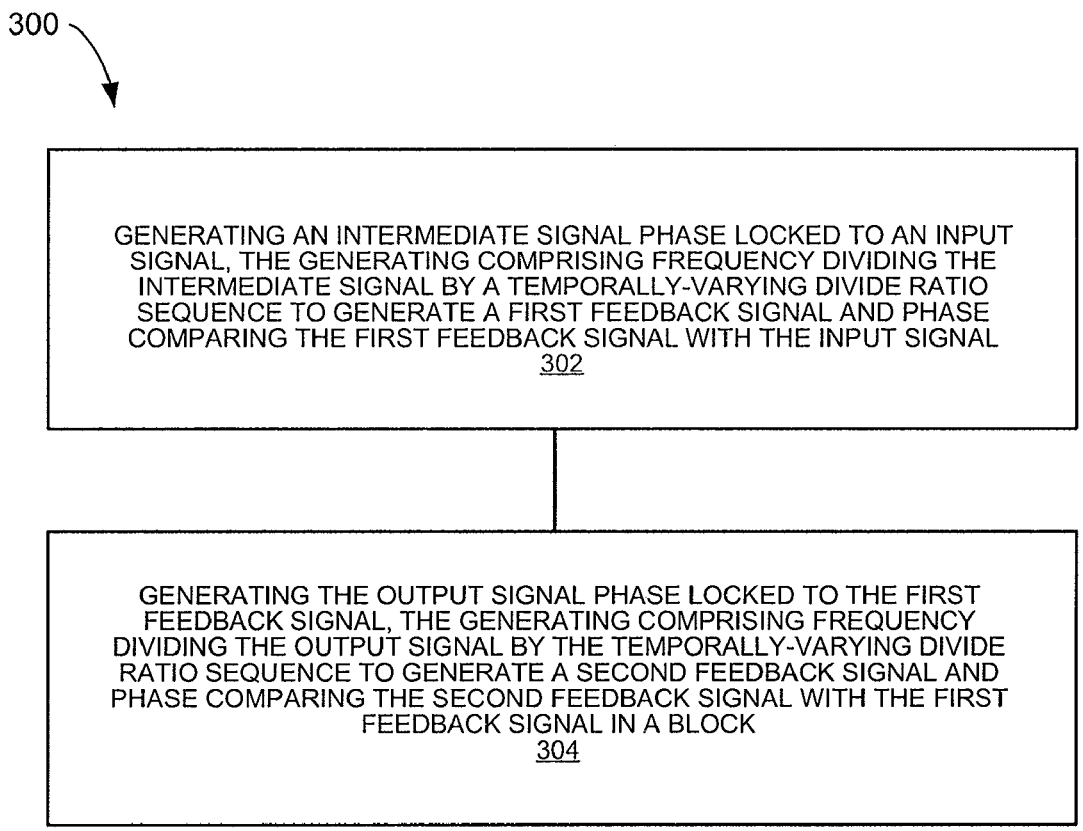
FIG. 2 is a flow chart of a method of generating a phase-locked output signal in accordance with another embodiment of the present invention.

Referring now to FIG. 2, therein is shown a flow chart of a method 300 for generating a phase-locked output signal in accordance with the present invention. The method 300 includes generating an intermediate signal phase locked to an input signal, the generating comprising frequency dividing the intermediate signal by a temporally-varying divide ratio sequence to generate a first feedback signal and phase comparing the first feedback signal with the input signal in a block 302; and generating the output signal phase locked to the first feedback signal, the generating comprising frequency dividing the output signal by the temporally-varying divide ratio sequence to generate a second feedback signal and phase comparing the second feedback signal with the first feedback signal in a block 304.

Thus, it has been discovered that the method and apparatus of the present invention furnish important and heretofore unavailable solutions, capabilities, and functional advantages for phase-locked loops. The resulting process and configurations are straightforward, economical, uncomplicated, highly versatile, and effective, use conventional technologies, and are thus readily suited for manufacturing devices that are fully compatible with conventional manufacturing processes and technologies.

While the invention has been described in conjunction with a specific best mode, it is to be understood that many alternatives, modifications, and variations will be apparent in light of the foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method of generating a phase-locked output signal, the method comprising:

generating an intermediate signal phase locked to an input signal, the generating compromising frequency dividing the intermediate signal by a temporally-varying divide ratio sequence to generate a first feedback signal and phase comparing the first feedback signal with the input signal; and generating the output signal phase locked to the first feedback signal, the generating comprising frequency dividing the output signal by the temporally-varying divide ratio sequence to generate a second feedback signal and phase comparing the second feedback signal with the first feedback signal.

2. The method as claimed in claim 1, wherein generating the first feedback signal and generating the output signal additionally comprises using Fractional_N phase-locked loops comprising substantially identical components.

3. The method as claimed in claim 1, wherein:
the method additionally comprises generating a sigma-delta modulated divide ratio sequence as the temporally-varying divide ratio sequence; and
frequency dividing the intermediate signal by the temporally-varying divide ratio sequence and frequency dividing the output signal by the temporally-varying divide ratio sequence are performed in response to the sigma-delta modulated divide ratio sequence.

4. The method as claimed in claim 3, wherein:
generating a sigma-delta modulated divide ratio sequence as the temporally-varying divide ratio sequence comprises using a sigma-delta modulator of an order higher than a first order sigma-delta modulator.

5. The method as claimed in claim 3, additionally comprising clocking the sigma-delta modulated divide ratio sequence with the first feedback signal.

6. The method as claimed in claim 1, wherein:
phase comparing the first feedback signal with the input signal generates a first comparison signal;
generating the intermediate signal additionally comprises:
filtering the first comparison signal to generate a first frequency control signal; and
generating the intermediate signal at a frequency defined by the first frequency control signal;
phase comparing the second feedback signal with the first feedback signal generates a second comparison signal; and
generating the output signal additionally comprises:
filtering the second comparison signal to generate a second frequency control signal; and
generating the output signal at a frequency defined by the second frequency control signal.

7. A Fractional_N phase locked loop, comprising:
a divide ratio sequence generator operable to generate a temporally-varying divide ratio sequence; and
a first phase-locked loop and a second phase-locked loop, each phase-locked loop comprising a phase comparator having a signal input, a feedback input and an output, and additionally comprising a loop filter, a VCO and a frequency divider, the loop filter, the VCO and the frequency divider connected in series between the output and the feedback input of the phase comparator; wherein:
the signal input of one of the phase comparators is directly connected to the feedback input of the other of the phase comparators;
the signal input of the other of the phase comparators is connected to receive an input signal; and
the frequency dividers each have a divide ratio control input connected to the divide ratio sequence generator to receive the temporally-varying divide ratio.

8. The Fractional_N phase-locked loop as claimed in claim 7, wherein the first phase-locked loop and the second phase-locked loop comprise identical components.

9. The Fractional_N phase-locked loops as claimed in claim 7, wherein the divide ratio sequence generator comprises a sigma-delta modulator.

10. The Fractional_N phase-locked loop as claimed in claim 9, wherein the sigma-delta modulator comprises a clock input connected to the feedback input of the other of the phase comparators.

11. The Fractional_N phase-locked loop as claimed in claim 9, wherein: the sigma-delta modulator comprises an output connected to the divide ratio control input of the frequency dividers.

12. The Fractional_N phase-locked loop as claimed in claim 9, wherein the sigma-delta modulator is of an order higher than a first order modulator.

13. The Fractional_N phase-locked loop as claimed in claim 9, wherein the sigma-delta modulator is a third order modulator.

14. A circuit for generating an output signal having a frequency defined by a divide ratio signal, the circuit comprising:
a divide ratio sequence generator connected to receive the divide ratio signal;
a first phase-locked loop and a second phase-locked loop, each phase-locked loop having a phase comparator and a signal input, a feedback input and an output and comprising a frequency divider connected between the output and the feedback input; wherein:
the signal input of one of the phase comparators is directly connected to the feedback input of the other of the phase comparators;
the output of the second phase-locked loop provides the output signal; and
each frequency divider has a divide ratio control input connected to the divide ratio sequence generator.

15. The circuit as claimed in claim 14, wherein the first phase-locked loop and the second phase-locked loop comprise substantially identical components.

16. The circuit as claimed in claim 14, wherein the divide ratio sequence generator comprises a sigma-delta modulator.

17. The circuit as claimed in claim 16, wherein the sigma-delta modulator comprises a clock signal input connected to the feedback input of the first phase-locked loop.

18. The circuit as claimed in claim 16, wherein the sigma-delta modulator is of an order higher than a first order modulator.

19. The circuit as claimed in claim 16, wherein the sigma-delta modulator is a third order modulator.

20. The circuit as claimed in claim 14, wherein:
each phase-locked loop additionally comprises:
a phase comparator providing the signal input and the feedback input of the phase locked loop;
a loop filter connected to the output of the phase comparator; and
a voltage controlled oscillator connected to the output of the loop filter; and
the frequency divider of each phase-locked loop is connected between the output of the voltage-controlled oscillator and the feedback input of the phase comparator.

* * * * *

UNITED STATES PATENT AND TRADEMARK OFFICE
CERTIFICATE OF CORRECTION

PATENT NO. : 7,574,185 B2  Page 1 of 1
APPLICATION NO. : 11/015132
DATED : August 11, 2009
INVENTOR(S) : Herbert L. Ko It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1269 days.

Signed and Sealed this

Seventh Day of September, 2010

David J. Kappos
*Director of the United States Patent and Trademark Office*